United States Patent [19]

Matsubara et al.

[11] Patent Number: 4,804,833

[45] Date of Patent: Feb. 14, 1989

[54] COLOR SENSING METHOD AND DEVICE THEREFOR

[75] Inventors: Ken Matsubara, Takatsuki; Shuji Iino, Hirakata; Hirohisa Kitano, Takatsuki, all of Japan

[73] Assignee: Minolta Camera Kabushiki Kaisha, Osaka, Japan

[21] Appl. No.: 904,189

[22] Filed: Sep. 5, 1986

[30] Foreign Application Priority Data

Sep. 6, 1985 [JP] Japan .................................. 60-198246

[51] Int. Cl.$^4$ .............................................. G01J 3/50
[52] U.S. Cl. .................... 250/211 J; 250/226
[58] Field of Search ............................ 250/226, 211 J; 357/30 L, 30 K

[56] References Cited

U.S. PATENT DOCUMENTS

| | | | |
|---|---|---|---|
| 3,821,549 | 6/1974 | Gloge ................... | 250/226 X |
| 3,858,233 | 12/1974 | Miyata et al. ........... | 357/30 L |
| 4,308,456 | 12/1981 | Van Der Gaag et al. ........ | 250/226 |
| 4,309,604 | 1/1982 | Yoshikawa et al. ............ | 250/226 |
| 4,379,636 | 4/1983 | Yoshida ........................ | 250/226 X |
| 4,395,629 | 7/1983 | Sasano et al. ................ | 250/226 |
| 4,520,381 | 5/1985 | Moriguchi et al. ............ | 250/226 X |
| 4,523,092 | 6/1985 | Nelson ........................ | 250/226 X |
| 4,547,074 | 10/1985 | Hinoda et al. ................ | 250/226 X |
| 4,620,058 | 10/1986 | Winterling et al. .......... | 357/30 K |

FOREIGN PATENT DOCUMENTS

| | | | |
|---|---|---|---|
| 0112535 | 8/1980 | Japan .................... | 250/226 |
| 99863 | 6/1984 | Japan . | |
| 0155933 | 8/1985 | Japan .................... | 250/226 |
| 0208870 | 10/1985 | Japan .................... | 357/30 L |
| 0245165 | 12/1985 | Japan .................... | 357/30 L |

OTHER PUBLICATIONS

Proceedings of the 43rd Meeting of the Japanese Society of Applied Physics, p. 318.

*Primary Examiner*—Stephen C. Buczinski
*Assistant Examiner*—Mark Hellner
*Attorney, Agent, or Firm*—Price, Gess & Ubell

[57] ABSTRACT

A method for sensing the color of incident light with a color sensing device, the color sensing device being a photoelectric device comprising an n-type or p-type amorphous silicon layer, being characterized in the following steps; measuring a first photocurrent of the photoelectric device generated by incident light when an electrical voltage having a predetermined parity is applied thereto; measuring a second photocurrent of the photoelectric device generated by the same incident light when another electrical voltage having a parity opposite to the predetermined parity is applied thereto, calculating the ratio of the first photocurrent to the second photocurrent; and identifying the color of incident light according to the ratio obtained.

A color sensing device, comprising: two elements including an n-type or p-type amorphous silicon layer; an electric power source for applying a positive voltage and a negative voltage to the two elements at the same time, respectively; and a divider means for calculating a ratio of the two photocurrents which flows in each elements.

8 Claims, 6 Drawing Sheets

PRIOR ART
Fig.1(a)    Fig.1(b)
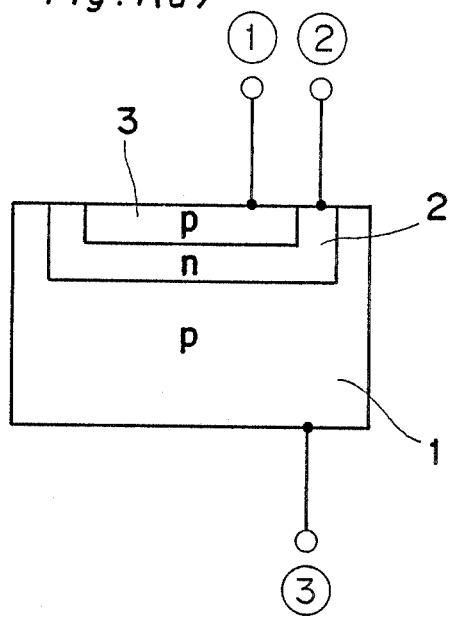
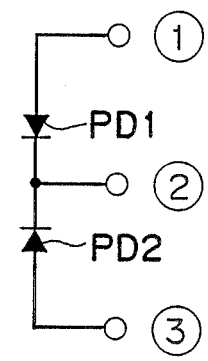
PRIOR ART
Fig.2
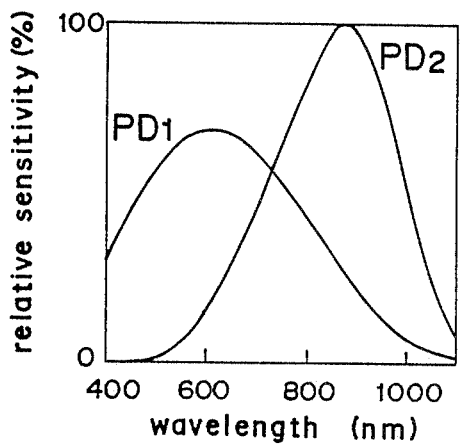
PRIOR ART
Fig.3
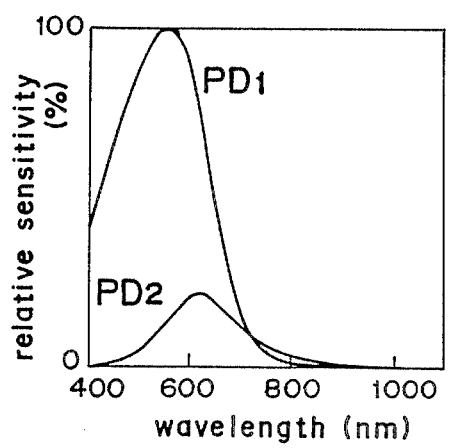

COLOR SENSING METHOD AND DEVICE THEREFOR

BACKGROUND OF THE INVENTION

1. Field of the Invention

The present invention relates to a color sensing method and a device therefor.

2. Description of the Prior Art

Many color sensing devices have been developed. For example, a color sensor shown in FIG. 1 (a) consists of a p-type layer 1, an n-type layer 2 and another p-type layer 3, each layers being formed successively in a mono-crystalline silicon material. The color sensor has two p-n junctions connected reversibly as indicated clearly by an equivalent circuit thereof shown in FIG. 1 (b), wherein PD1 and PD2 denote photodiodes with p-n junctions at a shallower position and at a deeper position, respectively. As shown in FIG. 2, the photodiode PD1 is sensitive to blue light while the photodiode PD2 has a peak of sensitivity at an infrared light. A color of an incident light can be determined from a ratio of the sensitivities of both PD1 and PD2 measured with respect to the wavelength of incident light.

It is necessary to add an infrared-absorbing filter in order to adapt the color sensor only to a visible light. However, this makes the structure thereof complicated. FIG. 3 shows the characteristics of the sensitivities of the photoconductors PD1 and PD2 when an infrared-absorbing filter is added.

FIG. 4 shows another prior art color sensor made of amorphous silicon (hereinafter referred to as a-Si) in combination with three-color separation filters (See the papers of Nakano et al., the Proceeding of the 43-rd meeting of the Japanese Society of Applied Physics, P.318). The color sensor is made by depositing a transparent electrode layer 12 and an a-Si layer (p-i-n) 13 successively on a glass layer 11, by forming three rear side electrodes 14, 15, 16 each in correspondence to each of three colors (red, green and blue), and by fixing filters 17, 18, 19 for transmitting one of these three colors respectively on the light-entering side (the lower side) of the glass plate 11 opposite to the electrodes 14, 15, 16, respectively. The incident light is decomposed into three colors by the three-color separation filters, and each separated color is transformed into electric signals in the a-Si layer 13. The color of the incident light can be identified from these electric signals. However, the structure of color sensor of this type becomes complicated, and, also, its cost becomes high.

An a-Si image sensor of a contact-type as shown in FIG. 5 (Jap. Patent laid open publication No. 99863/1984) can identify the color of incident light without any color filter. The image sensor is made by forming a plurality of separate metallic electrodes 22, a non-doped a-Si layer 23 and an transparent electrode layer 24 successively on a substrate 21.

The image sensor can identify the color of incident light by utilizing such a phenomenon that the spectral sensitivity varies with the electric voltage applied on the a-Si light-receiving surface. A ratio of two photo currents obtained, when two different bias voltages (for example, zero and a predetermined bias value) are applied, is calculated. The relation between the ratio and the wavelength of light has been obtained already. Therefore, the color of the incident light can be decided from the ratio obtained with respect to the incident light by referring to said relation.

Because the photoelectric part of the image sensor is made of a non-doped a-Si film, the variation of the photocurrent due to the bias voltage is small so that it is hard to identify the color according to the predetermined relationship obtained. Further, because the transparent electrode 24 is not separated into elements, different bias voltages cannot be applied at the same time so that the color cannot be read in real time.

SUMMARY OF THE INVENTION

An object of the present invention is to provide a method for identifying the color of incident light by means of a color sensor made of a-Si, wherein large color signals can be obtained and the color can be identified easily.

Another object of the present invention is to provide a color sensing device which can detect the color with a high sensitivity.

As for the difficulty of the identification of color by using the above-mentioned conventional color sensor wherein a bias voltage is applied to an a-Si layer, the inventors have found that the spectral sensitivity can be varied remarkably and that the ratio of photocurrents can be increased, if the a-Si layer is doped so as to act as an n-type or p-type semiconductor and if the sign of the voltage to be applied thereto is reversed from a plus to minus or vice versa. The doping of impurities into the a-Si layer in order to make it act as a p-type or n-type semiconductor enhances color signals (photocurrents). The reversal of the sign of the two bias voltages changes the spectral sensitivity thereof remarkably: the ratio of photocurrents is enhanced especially in a zone of relatively shorter wavelengths so that the identifications of color can be made easily.

A method for sensing the color of incident light according to the present invention uses a color sensing device having a photoelectric device which comprises an n-type or p-type amorphous silicon layer and includes the following steps: measuring a first photocurrent of said photoelectric device generated b incident light when an electrical voltage having a predetermined parity is applied thereto: measuring a second photocurrent of said photoelectric device generated by the same incident light when another electrical voltage having a parity opposite to said predetermined parity is applied thereto, calculating the ratio of said first photocurrent to said second photocurrent; and identifying the color of incident light according to the ratio obtained.

Another method for sensing the color of incident light according to the present invention uses a color sensing device having a photoelectric device comprising an substrate, at least two electrodes being formed on the substrate separately from each other, an n-type or p-type amorphous silicon layer formed on said electrodes and at least two transparent electrodes being formed on said amorphous silicon layer separately opposite to the electrodes on the substrate so as to divide the device into at least one pair of elements; and includes the following steps: applying electric voltages to said pair of elements, said voltages having parities different from each other: measuring each photocurrent of said two elements generated by the incident light; calculating the ratio of photocurrents measured; and identifying the color of incident light according to the ratio calculated.

A color sensing device according to the present invention comprises: an insulating substrate: two first electrodes being formed on said substrate separated from each other; an n-type or p-type amorphous silicon layer applied on said electrode; two second electrodes made of transparent conducting material being on said n-type or p-type amorphous silicon layer so as to oppose said first electrodes interposing said amorphous silicon layer, respectively, an electric power source for applying a positive voltage and a negative voltage to each pair of a first electrode and a second electrode at the same time: and a divider means for calculating a ratio of the two photocurrents obtained each of which flows between each pair of a first electrode and a second electrode.

An advantage of the present invention is to provide a method for identifying the color of incident light with a high sensitivity.

Another advantage of the present invention is t provide a method for identifying the color of incident light in real time.

A further advantage of the present invention is to provide a color sensing device which can identify the color of incident light with a high sensitivity in real time.

BRIEF DESCRIPTION OF THE DRAWINGS

The present invention will now be described more in detail by way of examples and with reference to the accompanying drawings, in which:

FIG. 1 (a) is an explanative sectional view of a color sensor, and FIG. 1 (b) is a diagram of the equivalent circuit of the color sensor shown in FIG. 1(a):

FIGS. 2 and 3 are graphs showing both spectral sensitivities of the photodiodes of a color sensor shown in FIG. 1 (a):

DESCRIPTION OF PREFERRED EMBODIMENTS

Figure 6:
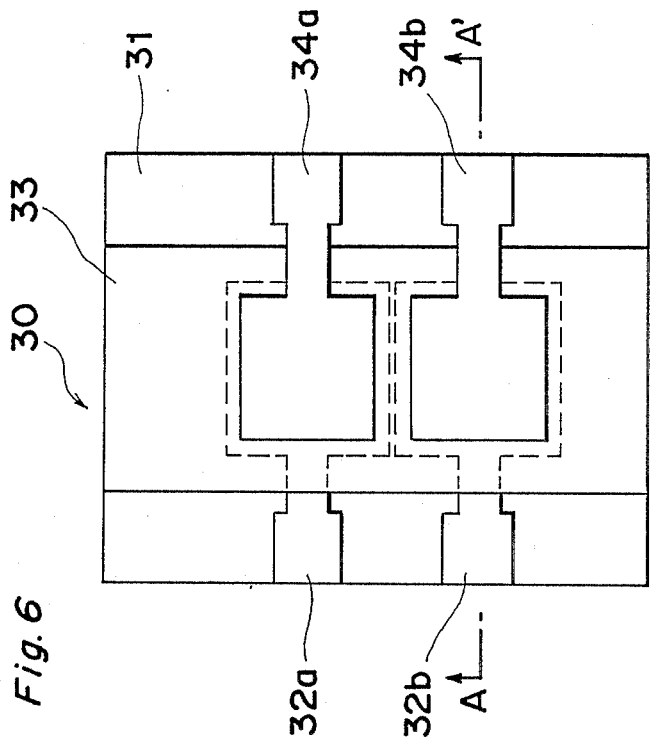
FIG. 6 is a schematic plan view of a color sensor according to the present invention.
Figure 7:
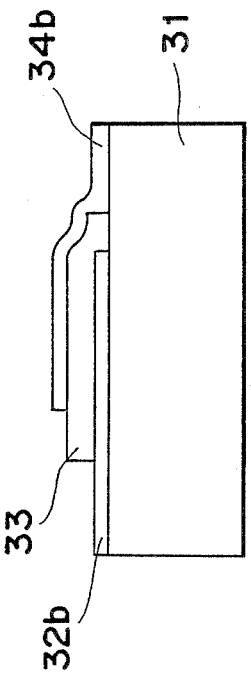
FIG. 7 is a sectional view of a color sensor along the line A—A' in FIG. 6.
Figure 4:
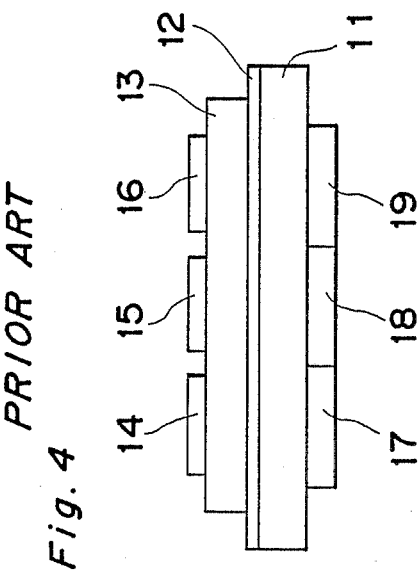
FIG. 4 is an explanative sectional view of a conventional color sensor with filters.
Figure 5:
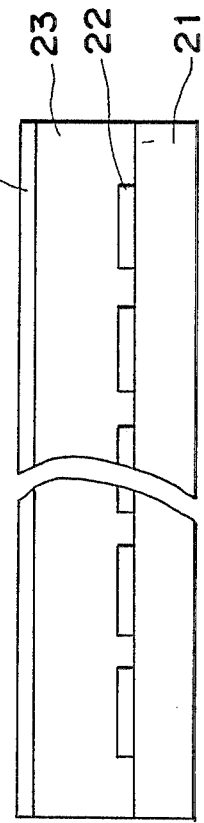
FIG. 5 is an explanative sectional view of a conventional image sensor of contact type.

FIGS. 6 and 7 show a color sensor 30 according to a preferred embodiment of the present invention. Two lower electrodes 32a and 32b are formed separately with each other with patterning on an insulating substrate 31, and a photoconductive layer 33 is formed so as to cover two lower electrodes. Then, transparent electrodes 34a and 34b are deposited on the photoconductor layer 33, separately with each other and so as to be opposite to the lower electrodes 32a and 32b and inbetween the photoconductive layer 33. In the present embodiment, the insulating substrate 31 is made of glass, the lower electrodes 32a, 32b are made of chromium, the photoconductor 33 is made of amorphous hydrogenated silicon, and the transparent electrodes 34a and 34b are made of indium tin oxide (ITO).

The color sensor 30 is produced as follows:

First, chromium is deposited on a glass substrate up to about 200 nm of thickness by using a DC sputtering process, and the lower electrodes 32a and 32b are formed by patterning them with use of a photolithography process into two identical configurations as shown in FIG. 6. Next, amorphous hydrogenated silicon is deposited by the use of a glow discharge process up to about 500 nm of thickness so as to form the photoconductive layer 33. On the deposition of amorphous hydrogenated silicon, the concentration of $B_2H_6$ against that of $SiH_4$ is 5 ppm, the flow rate is 300 SCAN, the pressure is 1 Torr, the RF power is 10 W, the temperature of the substrate is 250° C., and the deposition time is about 40 minutes. Further, a transparent conducting film of indium tin oxide is deposited thereon with use of an RF sputtering process. The target used is made of 95 mol % $In_2O_3$ + 5 mol % $SnO_2$. On the deposition of indium tin oxide, the pressure of argon on sputtering is $3-5 \times 10^{-3}$ Torr, and RF power is 300W. Then, the transparent electrodes 34a and 34b are formed by patterning the transparent conducting film with use of a photolithography process into configurations as shown in FIG. 6.

The photoconductor layer 33 has characteristics as a p-type semiconductor because boron atoms are doped as impurities. Therefore, if the transparent electrodes are biased negatively, holes as dominant carrier which are generated near the surface by incident light of shorter wavelength contribute hardly to a photocurrent generated because the lower electrodes are biased inversely for the holes.

If the photoconductor layer 33 is required to have characteristics as an n-type semiconductor, phosphor atoms are doped as impurities.

Figure 8:
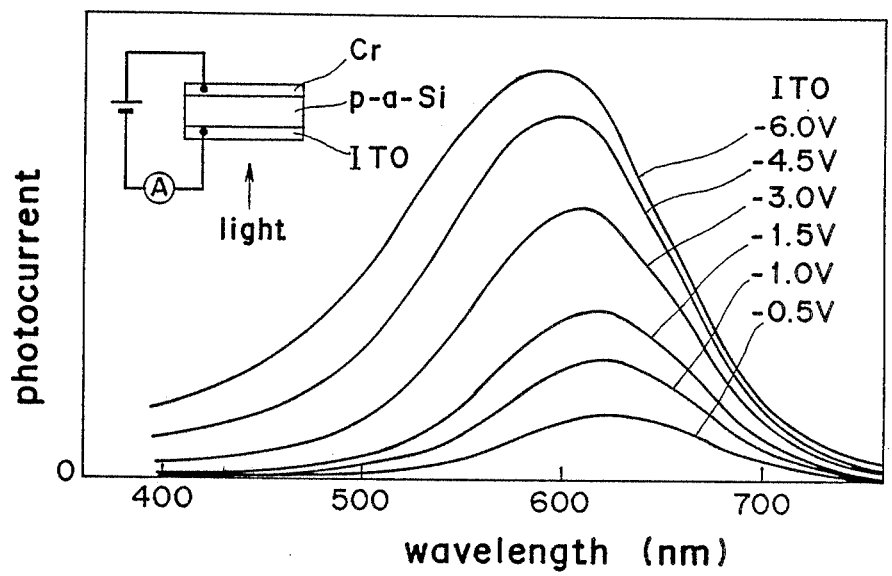
FIGS. 8 and 9 are graphs each showing a wavelength dependence of photocurrent.

FIG. 8 shows, as an example, data on the wavelength dependence of photocurrent when the transparent electrode (ITO) is biased negatively. The data indicates that the value of photocurrent varies remarkably with the value of negative bias voltage applied.

Figure 9:
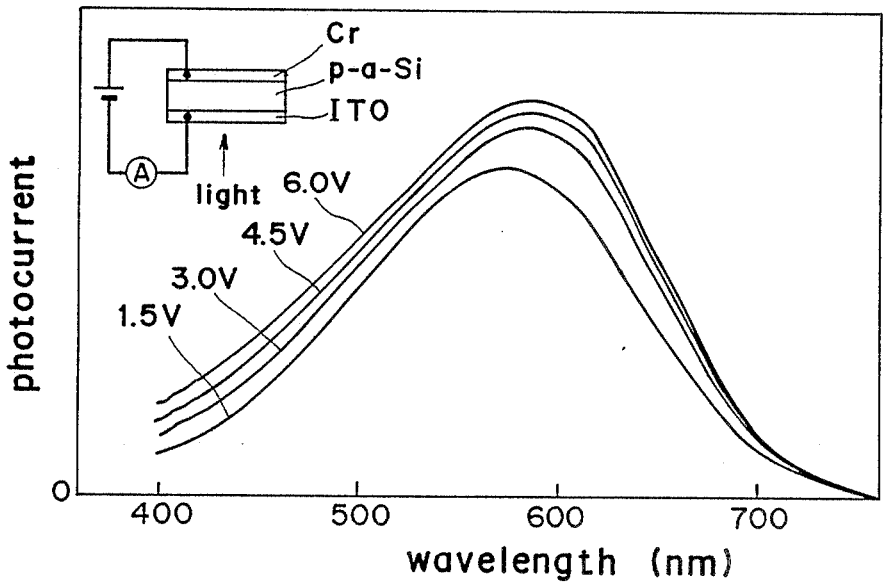

On the contrary, if the transparent electrode is biased positively, the holes generated near the surface flow easily to the counter electrodes so that the sensitivity on the side of shorter wavelengths is enhanced. FIG. 9 shows, as an example, data on the wavelength dependence of photocurrent when the transparent electrode (ITO) is biased positively. The data indicates that the value of photocurrent varies relatively little even when the value of the bias voltage is varied.

Figure 10:
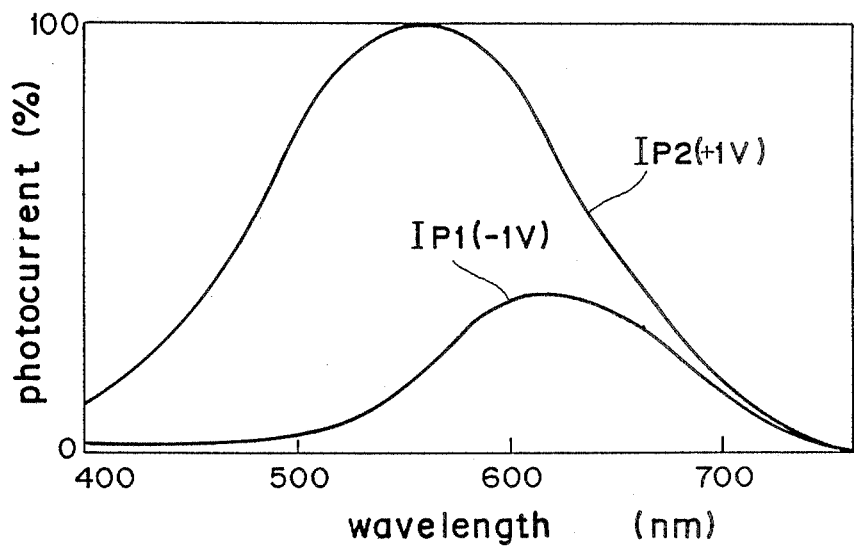
FIG. 10 is a graph showing the spectral characteristics of photocurrent obtained when the bias voltage is reversed.

FIG. 10 shows the spectral characteristics of photocurrents $I_{p1}$, $I_{p2}$ when the bias current is reversed, wherein $I_{p1}$ and $I_{p2}$ are photocurrents obtained when the transparent electrode is biased by −1V and +1V, respectively. It is to be noted that the wavelength at the peak of the photocurrent is shifted by reversing the bias voltage.

Figure 11:
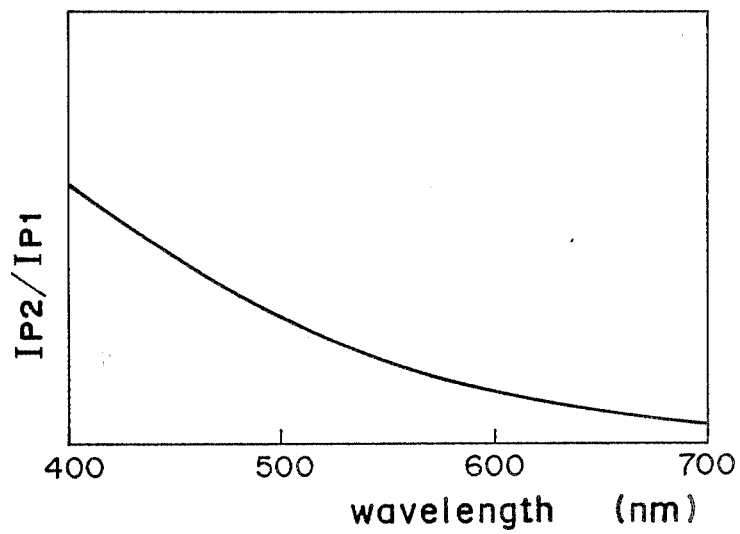
FIG. 11 is a graph showing the wavelength dependence of the ratio of two photo currents ($I_{p2}/I_{p1}$)

FIG. 11 shows a graph of the ratio $I_{p2}/I_{p1}$ plotted against the wavelength. It is clear that $I_{p2}/I_{p1}$ decreases monotonously with increasing wavelength. Therefore, the color of incident light can be identified by reading in real time the ratio $I_{p2}/I_{p1}$ of photocurrents from both elements for which the voltage is biased reversely with each other. In the present embodiment, the photoelectric part is made a p-type (or n-type) semiconductor by doping boron or the like. Then, the reversal of the voltage applied on the transparent electrode enhances the ratio of photocurrents on the side of shorter wavelengths so that the color o incident light can be identified easily.

Figure 12:
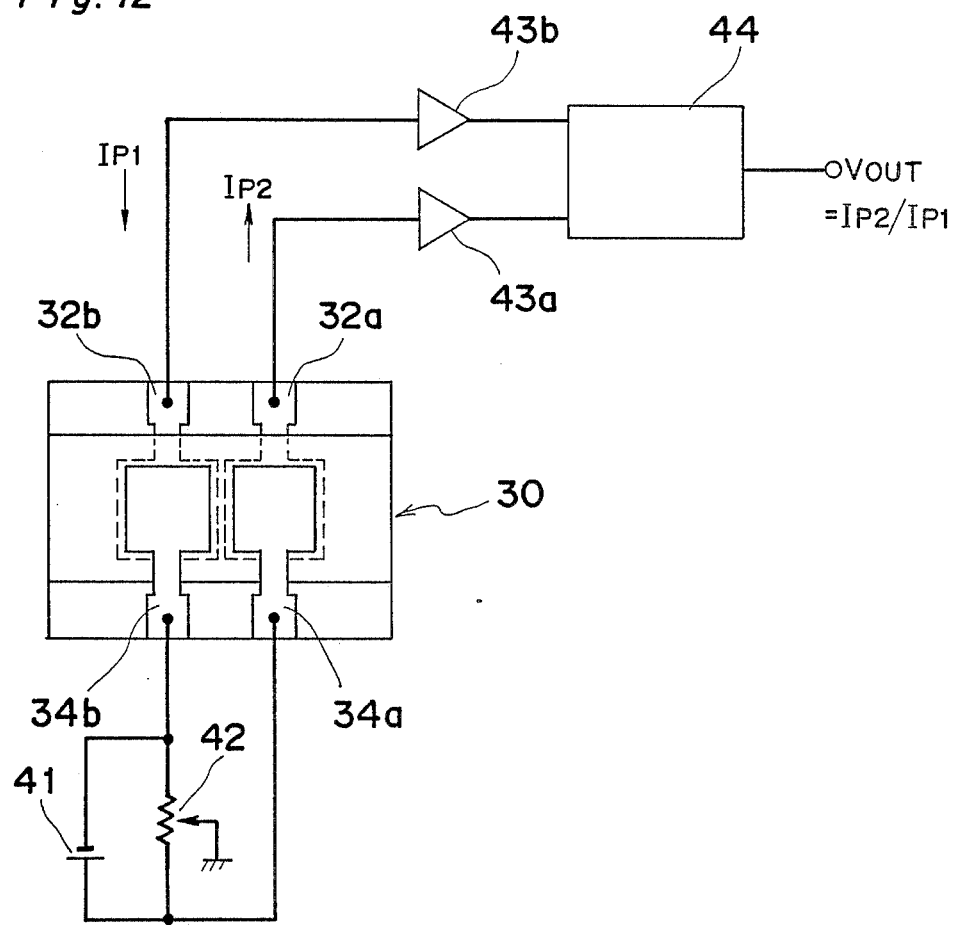
FIG. 12 is a diagram of a circuit for determining the ratio $I_{p2}/I_{p1}$.

FIG. 12 shows a block diagram of a circuit for identifying the color of incident light using the color sensor 30 according to the present invention. In this embodiment, the transparent electrodes 34a and 34b are separated so that different voltages can be applied to the transparent electrodes at the same time. An electric power source 41 is provided for applying a positive and a negative voltage to the transparent electrodes 34a and 34b, respectively. A variable resistor 42 is connected with the power source 41 in parallel, and the slidable contact of the variable resistor 42 is grounded. The values of the applied voltages can be varied by moving the slidable contact. Both terminals of lower chromium electrodes 32a, 32b are connected to input terminals of the amplifiers 43a and 43b for current amplification, respectively. After the currents $I_{p1}$ and $I_{p2}$ are amplified by the amplifiers 43a and 43b, the currents are send into a divider 44 provided for calculating a ratio of $I_{p2}$ to $I_{p1}$, and then, the divider gives a voltage $V_{out}$ being proportional to the ratio obtained. The wavelength which corresponds to the ratio $I_{p2}/I_{p1}$ is determined from the graph of the wavelength dependence of $I_{p2}/I_{p1}$ shown in FIG. 11. Thus, the wavelength of incident light on the color sensor 30 is obtained, so that the color thereof can be identified exactly.

If the photoconductor 33 is made of an n-type semiconductor, similar results can be realized except that the dominant carrier become electrons.

Figure 13:
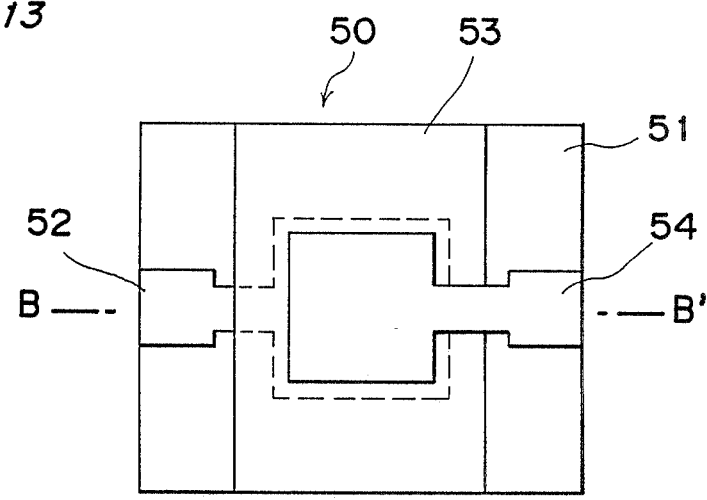
FIG. 13 is a schematic plan view of a color sensor according to the present invention.
Figure 14:
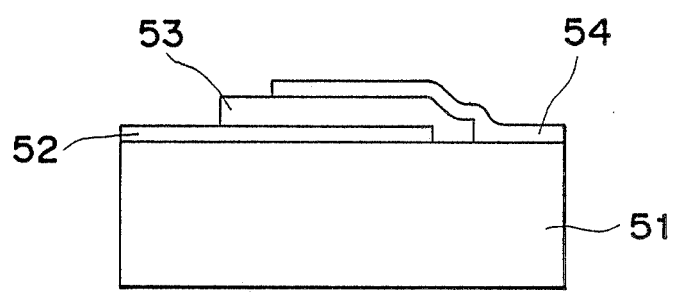
FIG. 14 is a schematic sectional view of a color sensor along the line B—B' in FIG. 13.

FIGS. 13 and 14 show a color sensor 50 according to another embodiment of the present invention. A lower electrode 52 is formed with patterning on an insulating substrate 51, and a photoconductive layer 53 is formed thereon. Then, a transparent electrode 54 is deposited on the photoconductive layer 53 so as to opposite to the lower electrode 52 interposing the photoconductive layer 53. Similarly to the first embodiment shown in FIGS. 6 and 7, the insulating substrate 51 is made of glass, the lower electrode 52 is made of chromium, the photoconductor 53 is made of amorphous hydrogenated silicon, and the transparent electrode 54 is made of indium tin oxide (ITO). The production method of the color sensor 50 is also similar to that of the color sensor 30.

The color of incident light cannot be identified in real time by using the color sensor 50. First a positive voltage is applied to the transparent electrode 54, and the photocurrent is measured. Next, a negative voltage is applied to the transparent electrode 54, and the photocurrent is measured again. Then, a ratio of both values of the photocurrent is calculated, and the wavelength of the color is decided from the predetermined relation shown in FIG. 11.

The color sensors 30, 50 need no color filters, that is, the structure of the color sensors is made simple. Therefore, the production steps of the color sensors can be simplified, and the production cost becomes low.

Figure 15:
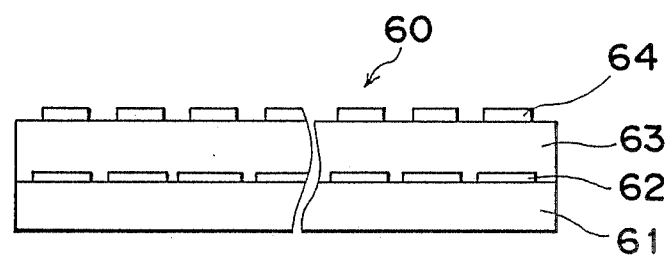
FIG. 15 is a schematical sectional view of a line color sensor according to the present invention.

FIG. 15 shows a color line sensor 60 wherein a number of metallic electrodes 62 are formed on a glass substrate 61, a photoconductor layer (for example, of n-type) 63 is deposited on them, and a number of transparent electrodes 64 are formed opposite to the metallic electrodes 62 on the photoconductive layer 63. Thus, color sensors each made from two elements are arranged linearly. The electrodes 62, 64 and the photoconductor layer 63 are produced similarly to the counterparts of the first embodiment shown in FIG. 6.

If an electric circuit such as shown i FIG. 12 is applied to each element the color can be recognized in real time along a line.

In the present invention, a photosensor (photoelectric device) is made of a-Si film. Therefore, the photoelectric device can be formed on an insulator such as glass and ceramics. In the embodiments shown in FIGS. 6, 13 and 15 color sensors 30, 50 and 60 are formed on a glass substrate on a lens of for example a video camera, the color sensor can be used for color correction. Then, the number of parts can be lessened because a color sensor is formed directly on a lens.

This invention may be practiced or embodied in still other ways without departing from the spirit or essential character thereof. The preferred embodiments described herein are therefore illustrative and not restrictive, the scope of the invention being indicated by the appended claims and all variations which come within the meaning of the claims are intended to be embraced therein.

What is claimed is:

1. A method for sensing the color of incident light with a color sensing device, said color sensing device being a photoelectric device comprising a substrate, at least two electrodes being formed on the substrate separately from each other, an amorphous silicon layer containing an impurity so as to act as an n-type or p-type semiconductor formed on said electrodes and at least two transparent electrodes being formed on said amorphous silicon layer separately opposite to the electrodes on the substrate so a to divide the device into at least one pair of elements and including the following steps:
    applying electric voltages to said pair of elements, said voltages having polarities different from each other;
    measuring each photocurrent of said two elements generated by the incident light;
    calculating the ratio of photocurrents measured, and identifying the color of incident light according to the ratio calculated.

2. A method according to claim 1, wherein said impurity is boron atoms and said amorphous silicon layer is a p-type.

3. A color sensing device, comprising:
    an insulating substrate;
    two first electrodes being formed on said substrate separate from each other;
    an amorphous silicon layer containing an impurity so as to act-as an n-type or p-type semiconductor applied on said electrodes;
    two second electrodes made of transparent conducting material being on said n-type or p-type amorphous silicon layer so as to oppose said first electrodes interposing said amorphous silicon layer, respectively;
    an electric power source for applying a positive voltage and a negative voltage to each pair of a first electrode and a second electrode at the same time, and a divider means for calculating a ratio of the two photocurrents obtained, each of which flows between each pair of a first electrode and a second electrode.

4. A color sensing device according to claim 3, wherein said insulating substrate is a lens.

5. The invention of claim 3 further including means for providing a predetermined ratio of photocurrent values to wavelength whereby the color of incident light can be calculated.

6. A color sensing device according to claim 3, wherein said impurity is boron atoms and said amorphous silicon layer is a p-type.

7. A color sensing device according to claim 3, wherein a plurality of said two first electrodes are formed on said substrate and are arranged linearly, said amorphous silicon layer is applied on said electrodes, and a plurality of said two second eletrodes is formed on said amorphous silicon layer so as to oppose said first electrodes on said amorphous silicon layer wherein a linear color sensing device is provided.

8. A color sensing device for identifying the color of incident light comprising:

an insulating substrate;

two first electrodes formed on the substrate and spaced from each other;

an amorphous silicon layer containing an impurity so as to act as an n-type or p-type semiconductor applied on said electrodes;

two second electrodes made of a transparent conducting material and positioned on the n-type or p-type amorphous silicon layer so as to be operatively positioned opposite the first electrodes, respectively;

an electric power source for applying a positive voltage to one set of electrodes and a negative voltage to the other set of electrodes;

means for measuring the photoelectric current from each set of electrodes when subject to incident light, and means for determining the color of the incident light from the measured photoelectric currents.

* * * * *